(12) United States Patent
Matsuno

(10) Patent No.: US 7,795,668 B2
(45) Date of Patent: Sep. 14, 2010

(54) SEMICONDUCTOR MEMORY DEVICE WITH SELECTIVE GATE TRANSISTOR

(75) Inventor: Koichi Matsuno, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 11/772,446

(22) Filed: Jul. 2, 2007

(65) Prior Publication Data
US 2008/0087935 A1 Apr. 17, 2008

(30) Foreign Application Priority Data
Sep. 29, 2006 (JP) ............................. 2006-267022

(51) Int. Cl.
*H01L 29/788* (2006.01)
(52) U.S. Cl. ............... 257/316; 257/288; 257/E21.682; 257/E27.103
(58) Field of Classification Search ................. 257/316, 257/E27.103, 288, E21.668, E21.682
See application file for complete search history.

(56) References Cited

U.S. PATENT DOCUMENTS

| 6,060,740 A | 5/2000 | Shimizu et al. |
| 7,052,971 B2 | 5/2006 | Nishiyama et al. |
| 2002/0038402 A1* | 3/2002 | Kanaya .......................... 711/1 |
| 2003/0030123 A1* | 2/2003 | Ichige et al. ................. 257/500 |
| 2006/0151855 A1 | 7/2006 | Kiyotoshi et al. |
| 2006/0175718 A1 | 8/2006 | Nitta |
| 2006/0246684 A1 | 11/2006 | Hoshi et al. |
| 2006/0275999 A1 | 12/2006 | Kitamura et al. |

FOREIGN PATENT DOCUMENTS

JP 2006-196843 7/2006

* cited by examiner

*Primary Examiner*—Lynne A Gurley
*Assistant Examiner*—Vernon P Webb
(74) *Attorney, Agent, or Firm*—Oblon, Spivak, McClelland, Maier & Neustadt, L.L.P.

(57) ABSTRACT

A semiconductor device includes a pair of selective gate lines formed above a semiconductor substrate, plural word lines formed above the substrate, plural contact plugs located between the selective gate lines, a first insulator formed in the trenches between the word lines, the first insulator including a first insulating film having a first upper surface flush with the substrate surface, a second insulator formed in the trenches between the contact plugs and including second and third insulating films, and a boro-phosphor-silicate glass film formed on the third insulating film and between the contact plugs. The second insulating film is of a kind same as the first insulating film. The third insulating film has a higher resistance to a wet etching process than the second insulating film. An interface between the second and third insulating films is located between a bottom and an upper end of the trench.

7 Claims, 24 Drawing Sheets

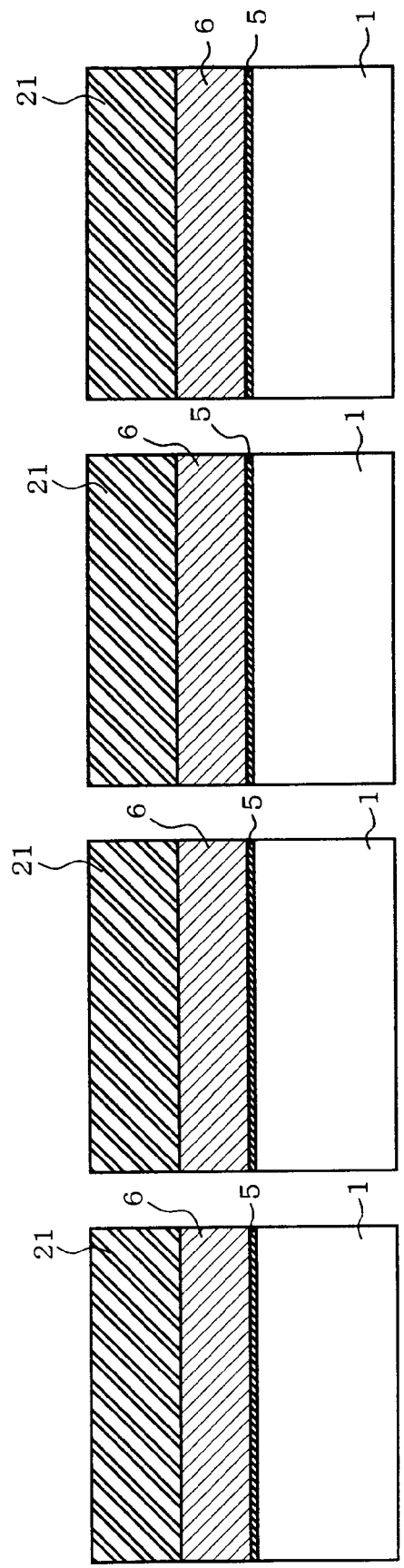

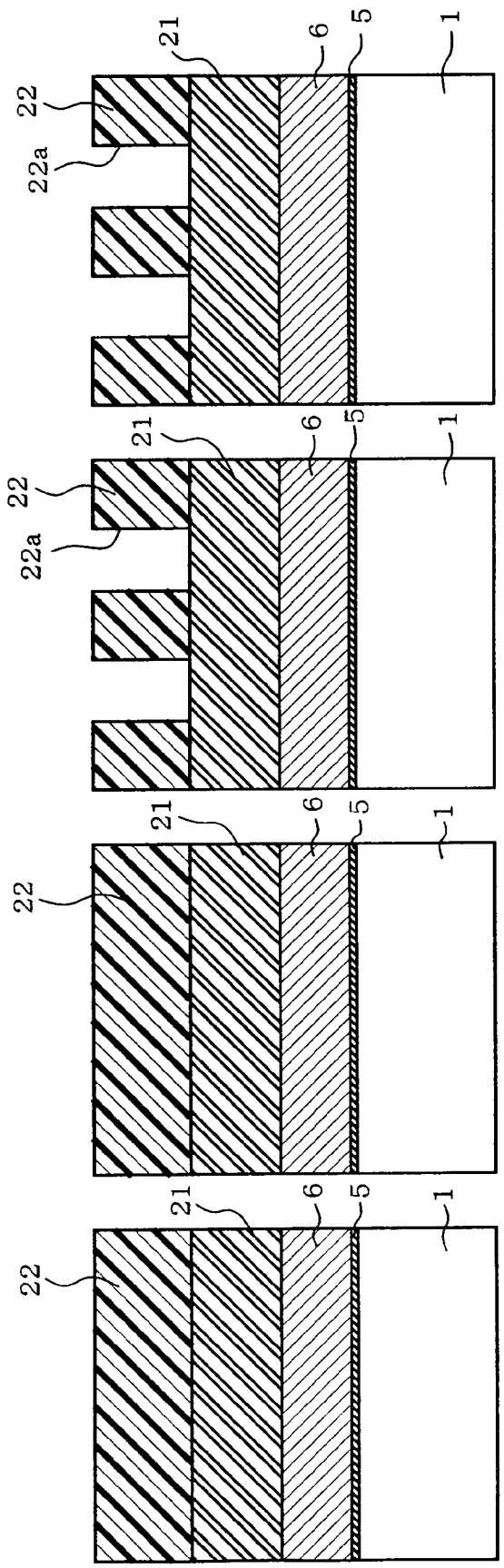

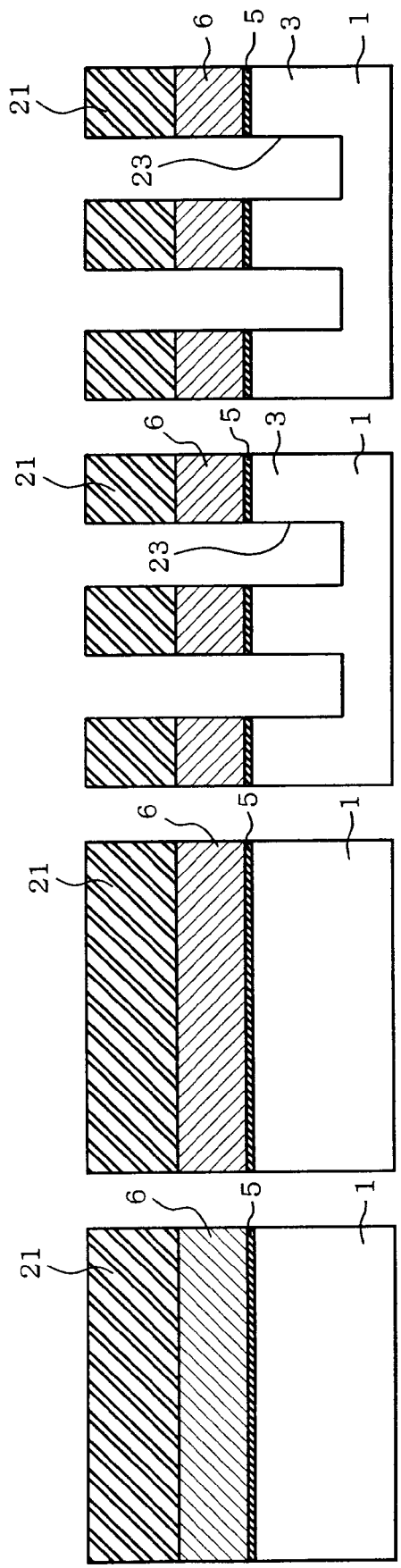

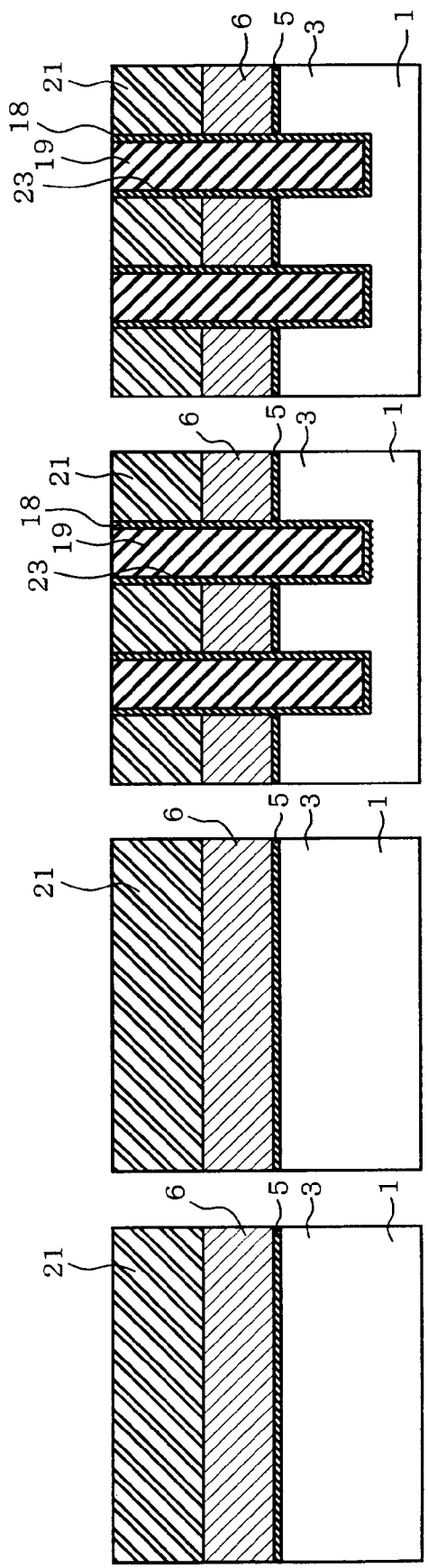

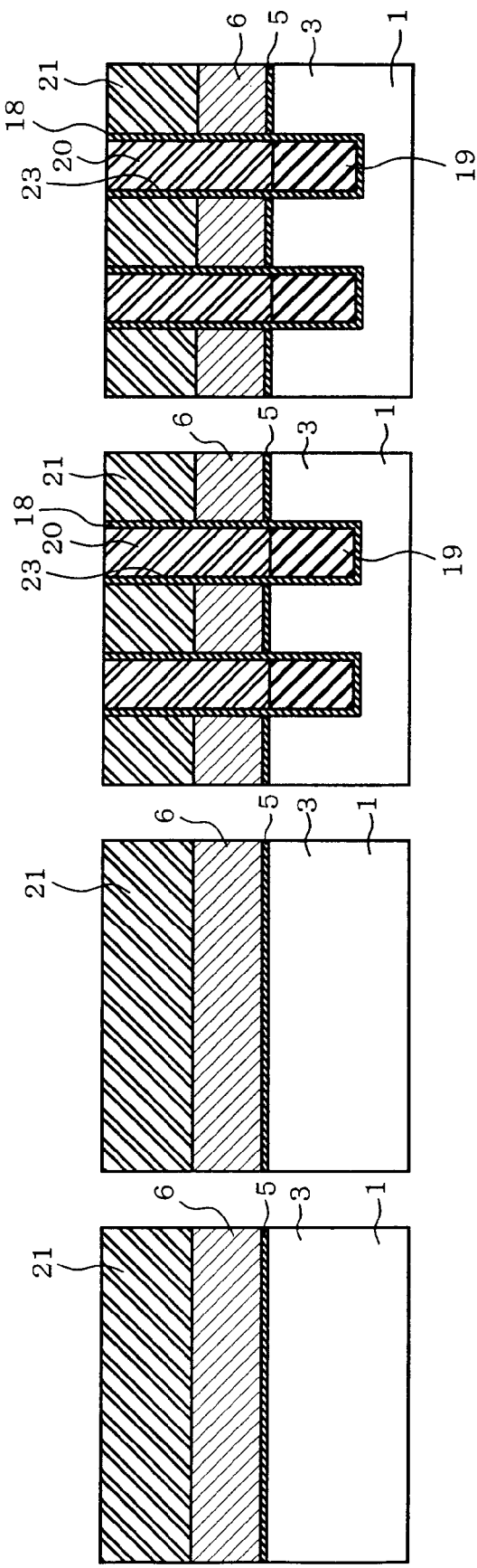

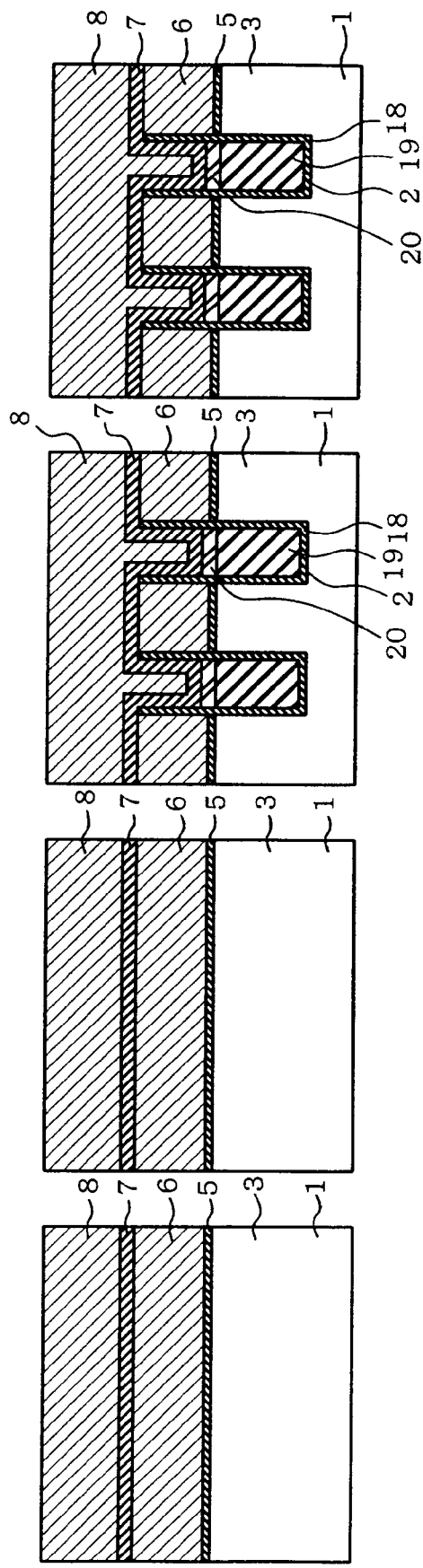

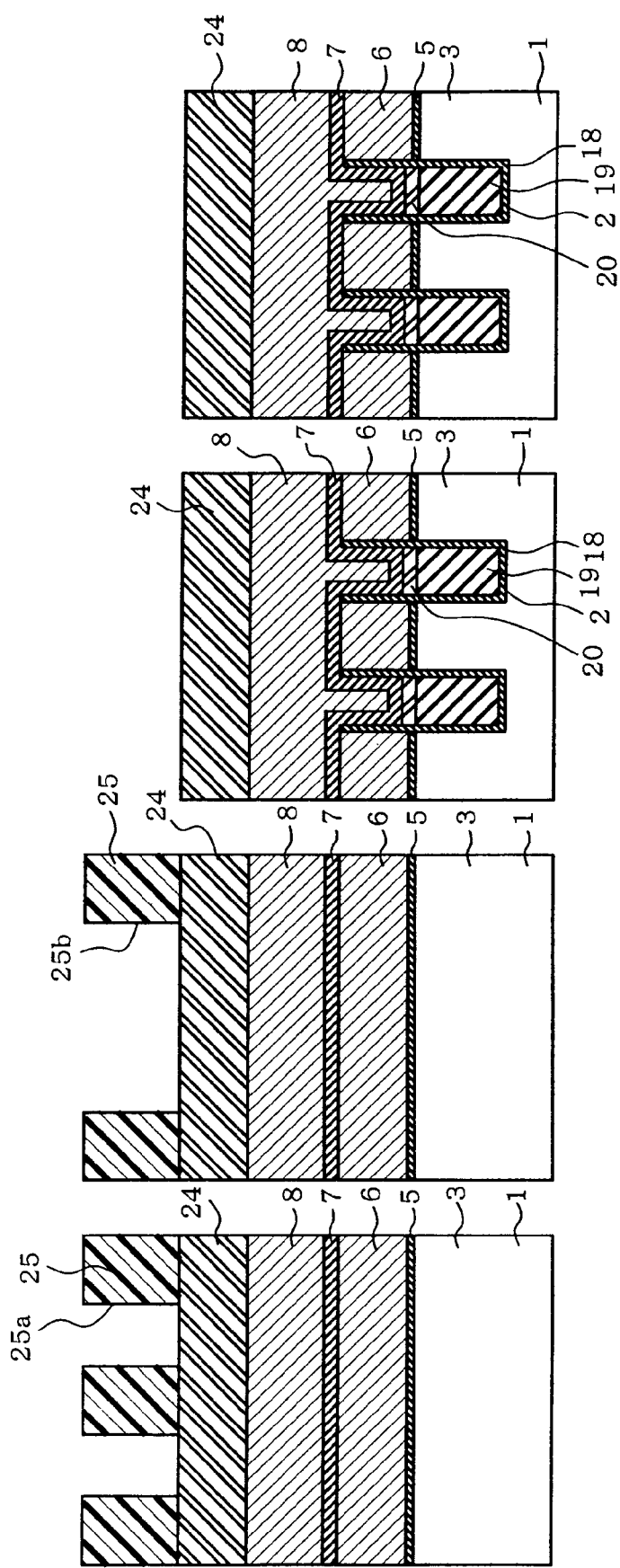

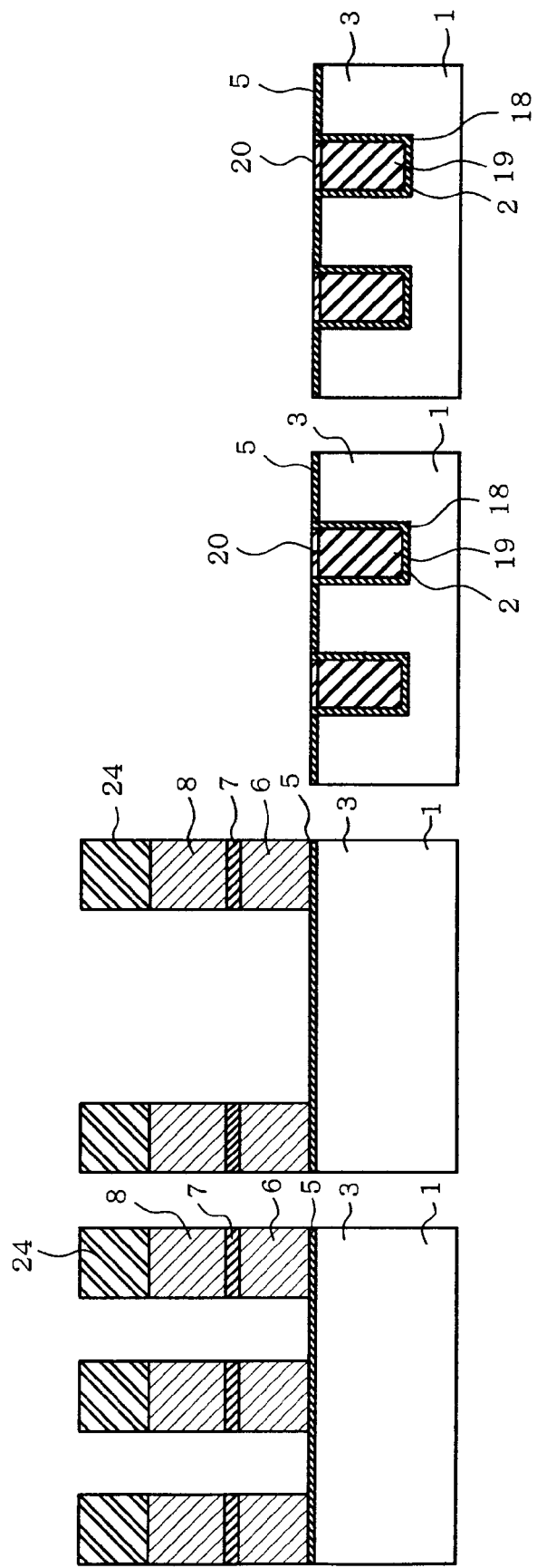

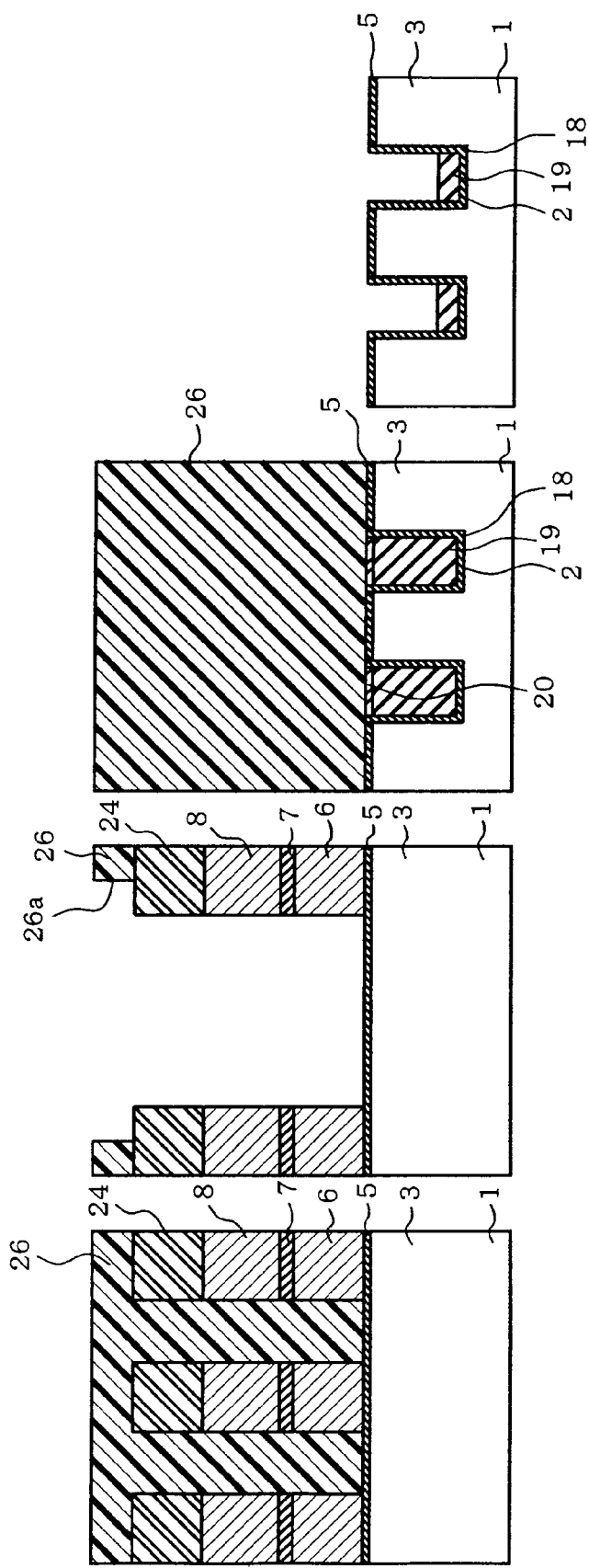

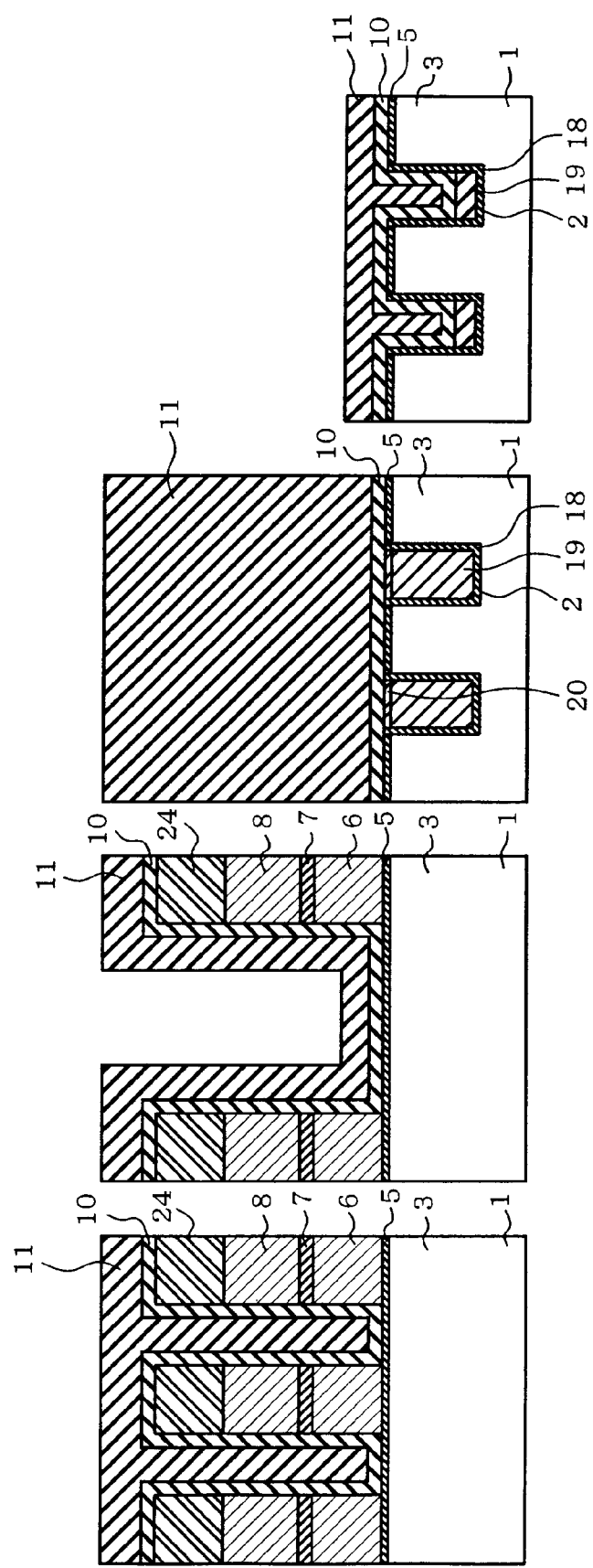

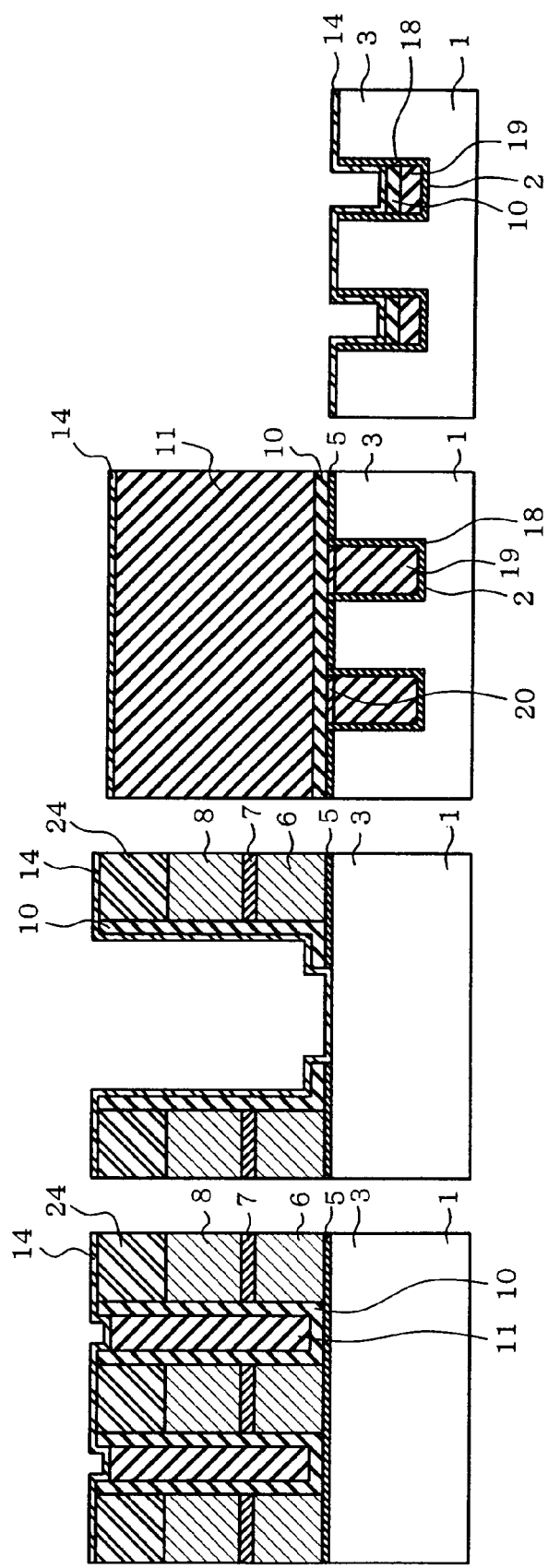

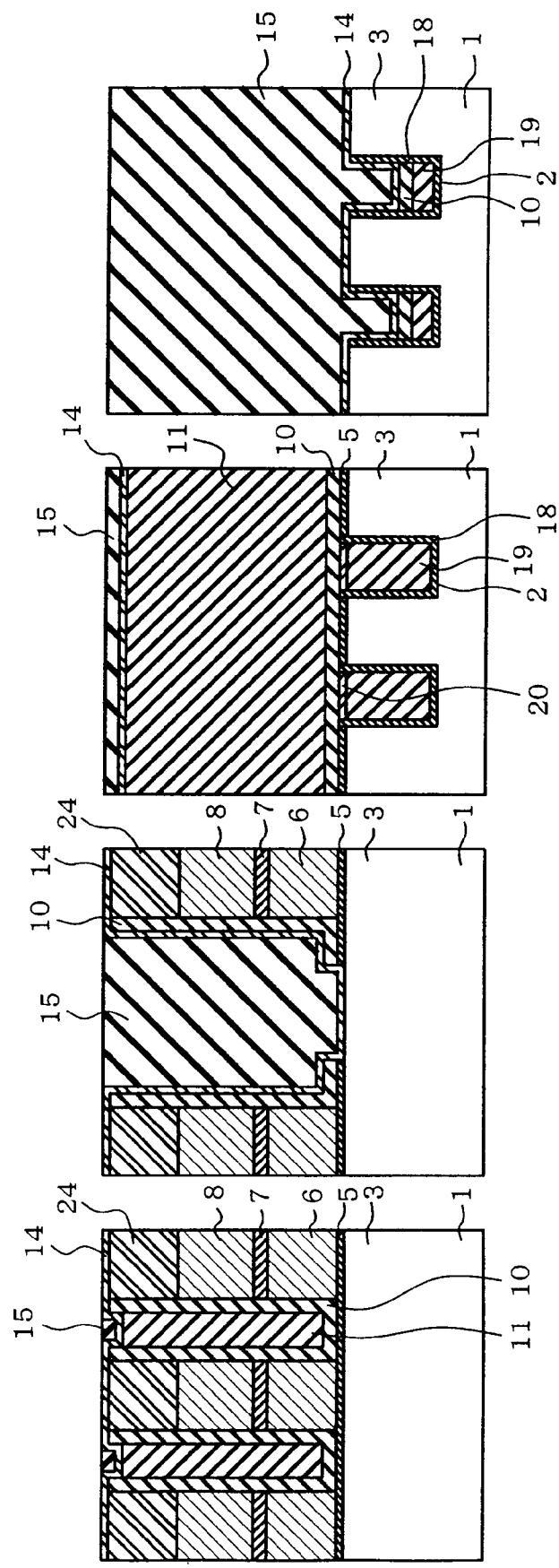

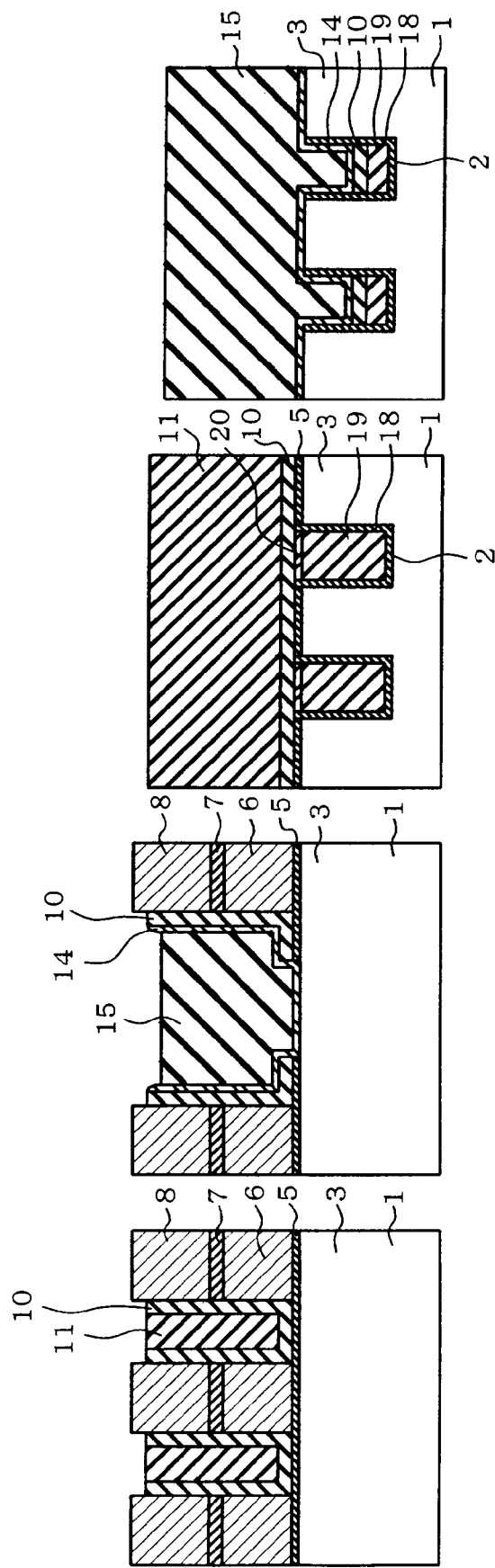

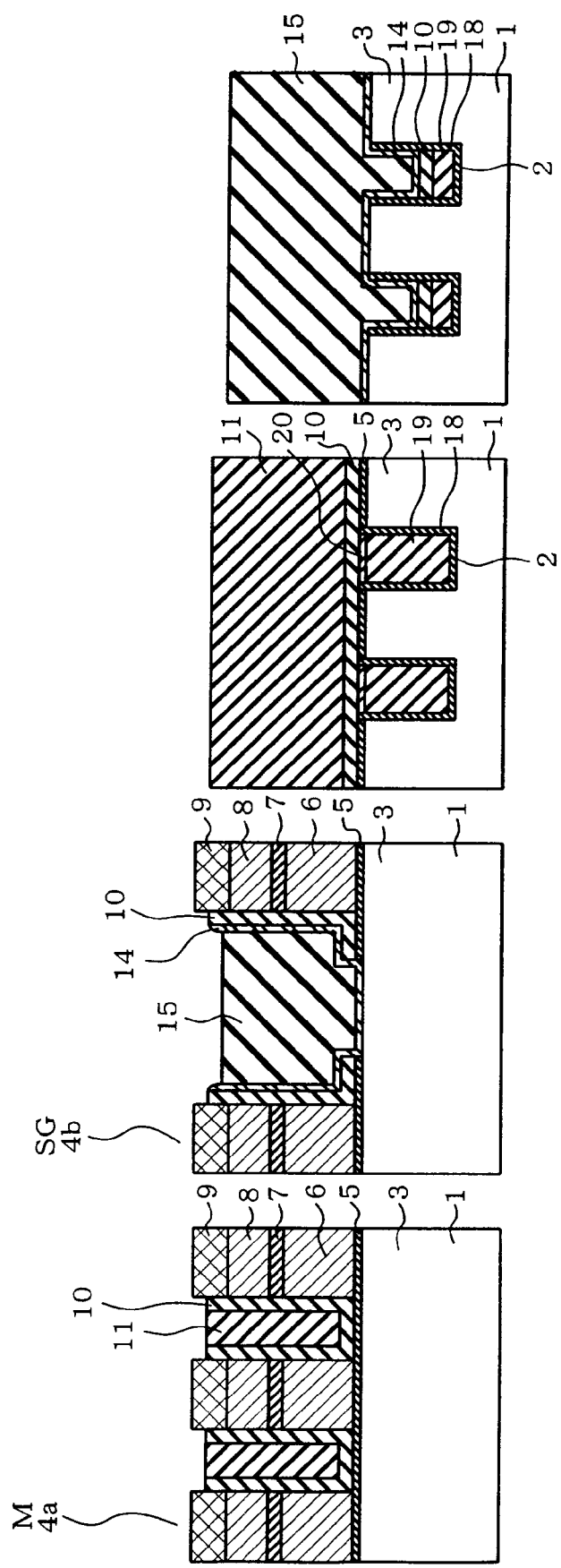

SEMICONDUCTOR MEMORY DEVICE WITH SELECTIVE GATE TRANSISTOR

CROSS-REFERENCE TO RELATED APPLICATIONS

This application is based upon and claims the benefit of priority from the prior Japanese Patent Application No. 2006-267022, filed on Sep. 29, 2006, the entire contents of which are incorporated herein by reference.

BACKGROUND OF THE INVENTION

1. Field of the Invention

The present invention relates to a semiconductor device having a shallow trench isolation (STI) structure employed for isolation between elements in a memory cell region and a method of fabricating the same.

2. Description of the Related Art

In semiconductor devices constituting integrated circuits, refinement has progressed for the purpose of improving integration. The refinement includes reduction in an element isolation region as one of elements thereof. A shallow trench isolation (STI) technique has recently been introduced and realized element isolation by the employment of trenches with smaller widths. However, when an insulating film is insufficiently buried in a trench formed in a semiconductor substrate, an insulation property of the substrate would be adversely affected.

In view of the aforesaid problem, use of a coating type oxide film has conventionally been proposed as by JP-A-2006-196843. The coating type oxide film includes solutions such as a solution of silazane perhydride polymer. The solution is spin-coated and thermally treated so as to be buried as an oxide film in a trench.

Element isolation regions are formed in both memory cell regions and peripheral circuit regions by an STI process in nonvolatile semiconductor devices respectively. In this case, after formation of the trench, a silicon oxide film is formed by a film forming method such as high density plasma (HDP) process so as to be buried in the trench. However, with progress of refinement of elements, void easily tends to occur in a narrow part of a region in which the silicon oxide film is buried.

The following countermeasure has been proposed to prevent occurrence of void. In burying the silicon oxide film in a trench, forming of the silicon oxide film is stopped before an upper opening of void occurring in a mid stage of the burying is closed by further execution of the burying. A polysilazane liquid is spin-coated so as to fill the void through the upper opening. A thermal treatment can be carried out after spin coating so that the polysilazane liquid is changed into a silicon oxide film. As a result, even when void occurs, the void is filled with the silicon oxide film such that an insulating film with high quality can be formed.

However, the silicon oxide film made from the aforesaid polysilazane liquid is generally difficult to treat in subsequent fabricating steps and accordingly has a difficulty in use with respect to process capability. For example, the silicon oxide film made from the polysilazane liquid has a higher etching rate than thermally-oxidized films in a wet process, whereupon the controllability of the silicon oxide film is difficult to increase.

BRIEF SUMMARY OF THE INVENTION

Therefore, an object of the present invention is to provide a semiconductor device in which the process capability in the fabricating steps can be maintained in a desired level and a method of fabricating the semiconductor device.

According to one aspect of the invention, there is provided a semiconductor device comprising a semiconductor substrate including a surface having a plurality of trenches each formed along a first direction and element regions located between the trenches, a pair of selective gate lines formed above the semiconductor substrate and formed along a second direction which intersects perpendicularly in the first direction, a plurality of word lines formed above the semiconductor substrate and formed adjacent to the selective gate lines along the second direction, a plurality of contact plugs located between the selective gate lines, the contact plugs being formed on the element regions respectively, a first insulator formed in the trenches between the word lines, the first insulator including a first insulating film having a first upper surface that is flush with the surface of the semiconductor substrate, and a second insulator formed in the trenches between the contact plugs and including a second insulating film and a third insulating film formed on the second insulating film, and a boro-phosphor-silicate glass (BPSG) film formed on the third insulating film and between the contact plugs, wherein the second insulating film is of a kind same as the first insulating film, the third insulating film has a higher resistance to a wet etching process than the second insulating film, an interface between the second and third insulating films is located between a bottom and an upper end portion of the trench.

BRIEF DESCRIPTION OF THE DRAWINGS

Other objects, features and advantages of the present invention will become clear upon reviewing the following description of the embodiment with reference to the accompanying drawings, in which:

FIGS. 3A to 3D are schematic sectional views showing a first stage of the fabricating process;

FIGS. 4A to 4D are schematic sectional views showing a second stage of the fabricating process;

FIGS. 5A to 5D are schematic sectional views showing a third stage of the fabricating process;

FIGS. 6A to 6D are schematic sectional views showing a fourth stage of the fabricating process;

FIGS. 8A to 8D are schematic sectional views showing a sixth stage of the fabricating process;

FIGS. 9A to 9D are schematic sectional views showing a seventh stage of the fabricating process;

FIGS. 10A to 10D are schematic sectional views showing an eighth stage of the fabricating process;

FIGS. 11A to 11D are schematic sectional views showing a ninth stage of the fabricating process;

FIGS. 12A to 12D are schematic sectional views showing a tenth stage of the fabricating process;

FIGS. 13A to 13D are schematic sectional views showing an eleventh stage of the fabricating process;

FIGS. 16A to 16D are schematic sectional views showing a fourteenth stage of the fabricating process;

FIGS. 17A to 17D are schematic sectional views showing a fifteenth stage of the fabricating process;

FIGS. 18A to 18D are schematic sectional views showing a sixteenth stage of the fabricating process;

FIGS. 19A to 19D are schematic sectional views showing a seventeenth stage of the fabricating process;

DETAILED DESCRIPTION OF THE INVENTION

Figures 1A, 1B, 1C, 1D:
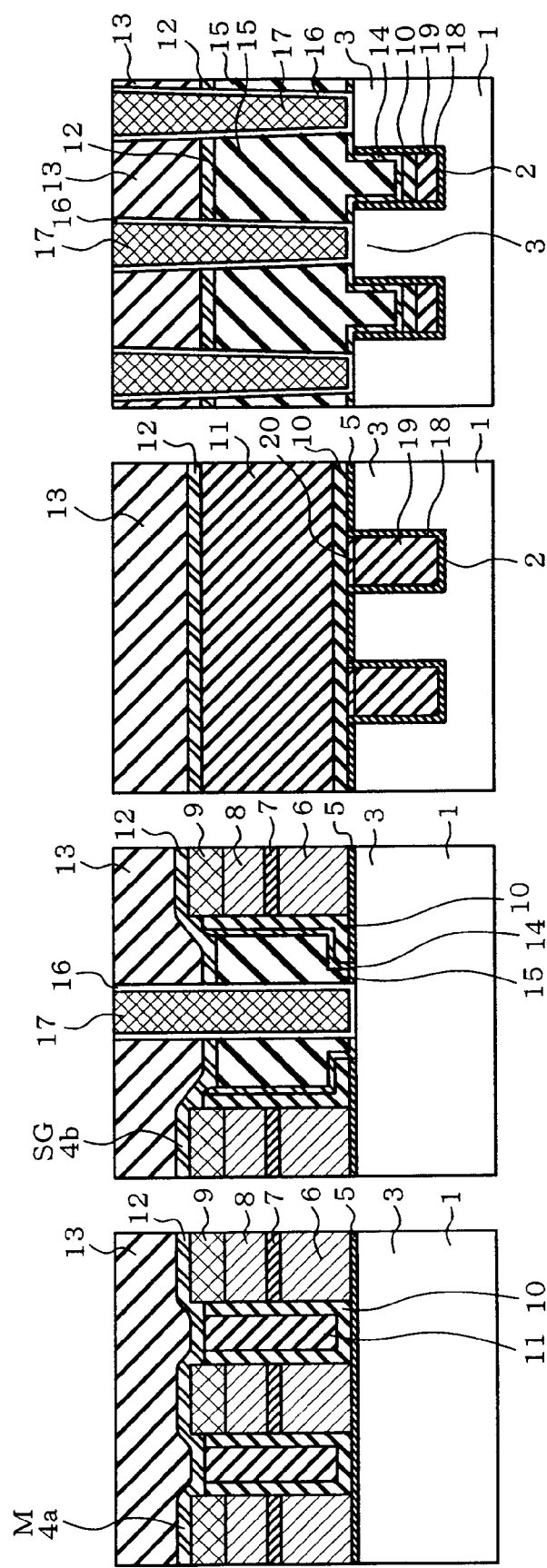
FIGS. 1A to 1D are schematic sectional views of a memory cell transistor and a selective gate transistor in one embodiment of the present invention.

One embodiment of the present invention will be described with reference to the accompanying drawings. The invention is applied to a NAND flash memory. In the drawings, identical or similar parts are labeled by the same reference symbols throughout figures. However, views are frame formats and the relationship between a thickness and plane dimensions, ratios of thicknesses of respective layers and the like differ from actual ones.

Figure 2:
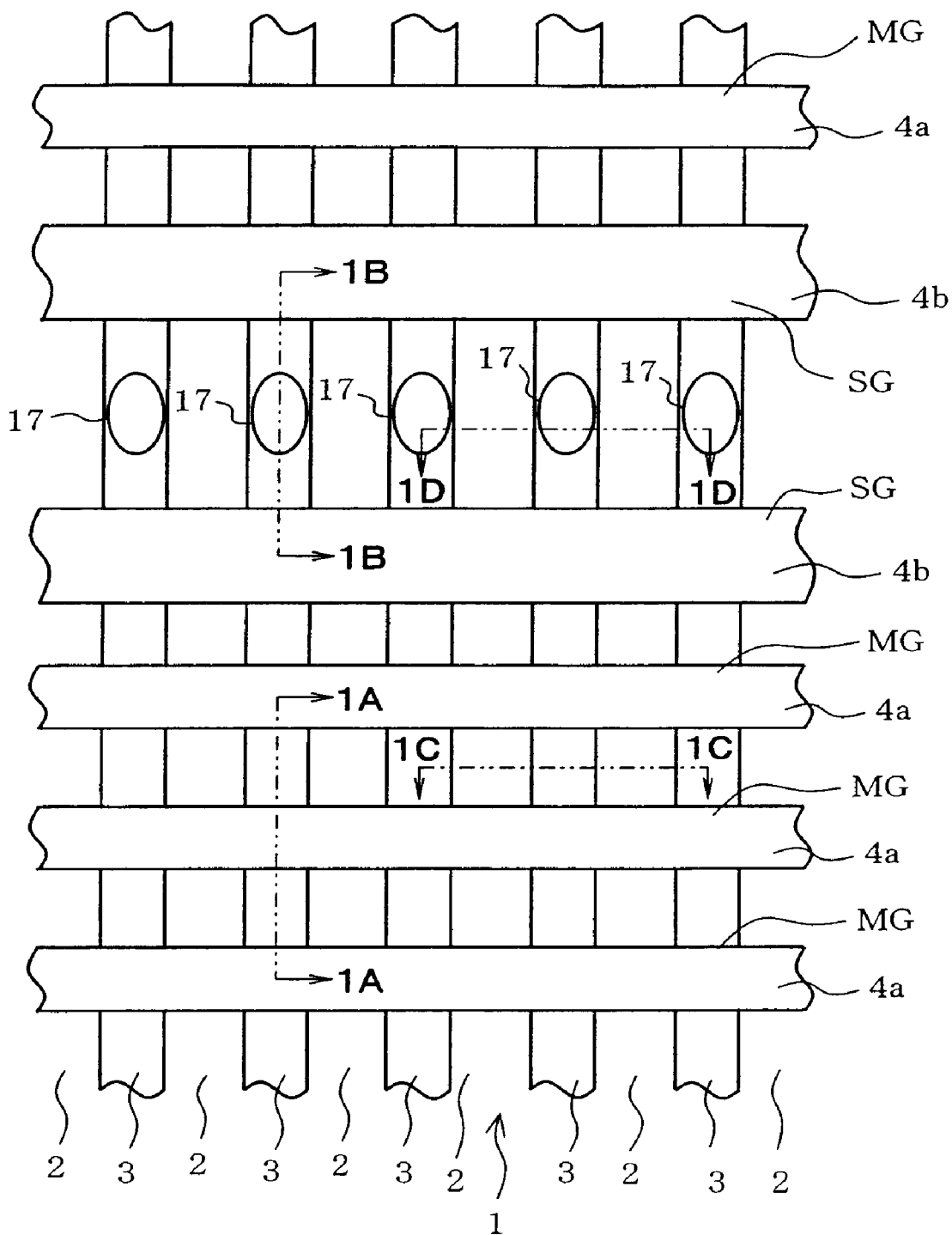
FIG. 2 is a schematic plan view showing an arrangement of gate electrodes and STI.
Figures 7A, 7B, 7C, 7D:
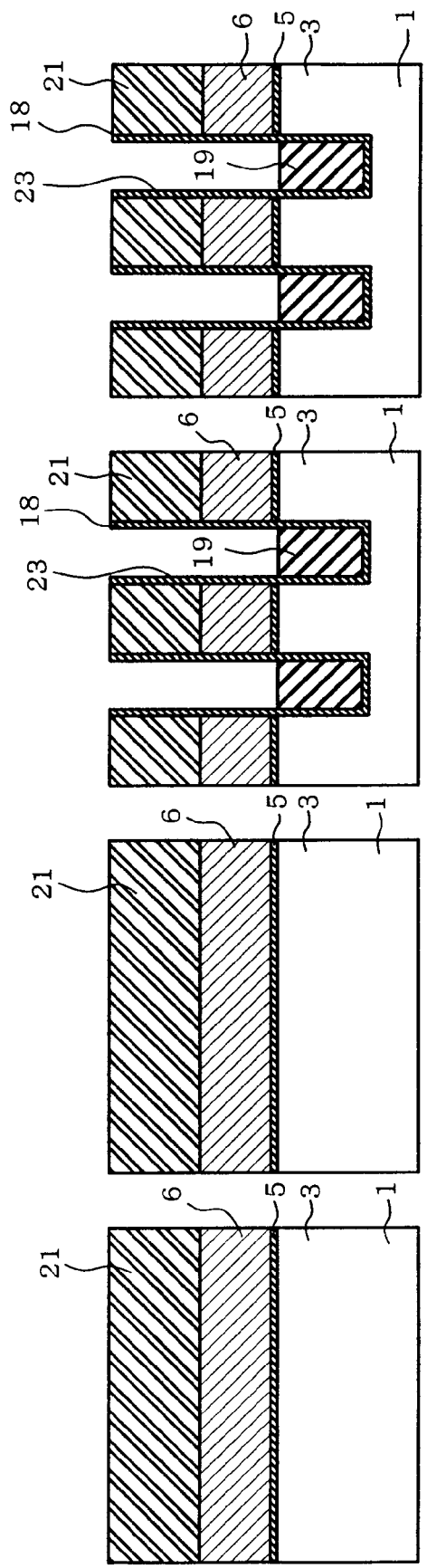
FIGS. 7A to 7D are schematic sectional views showing a fifth stage of the fabricating process.

FIG. 2 schematically shows a memory cell region of the NAND flash memory. A silicon substrate 1 serving as a semiconductor substrate includes a memory cell region in which active regions 3 serving as element forming regions are formed along a first direction into the shape of a strip by shallow trench isolation (STI) 2 serving as element isolation regions as shown in FIG. 2. The STI 2 is formed by burying a plurality of types of insulating films in trenches formed at predetermined intervals in the silicon substrate 1.

A memory cell transistor has word lines 4a and a selective gate transistor has selective gate lines 4b. The word lines 4a and the selective gate lines 4b are formed in an upper surface of the silicon substrate 1 along a second direction so as to be perpendicular to the STI 2. The interval between the selective gate lines 4b is set so as to be wider than the interval between the word lines 4a. Gate electrodes MG of the memory cell transistor are formed in regions where the word lines 4a intersect with the active regions 3 on the silicon substrate 1. Gate electrodes SG of the selective gate transistor are formed in regions where the selective gate lines 4b intersect with the active regions 3 on the silicon substrate 1. Furthermore, bit line contacts 17 are formed on the active regions 3 between the selective gate lines 4b.

FIGS. 1A to 1D are schematic longitudinal sections taken along lines 1A-1A, 1B-1B, 1C-1C and 1D-1D respectively. FIGS. 3A-3D to FIGS. 22A-22D are similar to FIGS. 1A to 1D respectively. More specifically, FIGS. 1A and 1B are sectional views taken along the active region 3 of the selective gate transistor. FIG. 1C is a sectional view of a section between the word lines 4a along the word line 4a of the memory cell transistor. FIG. 1D is a sectional view of a region of bit line contact 16 taken along the selective gate line 4b.

In FIG. 1A showing the gate electrode MG of the memory cell transistor, a gate oxide film 5 serving as a gate insulating film is formed on a surface of the active region 3 formed by the STI 2 on the silicon substrate 1 as shown in FIG. 2. Gate electrodes MG are formed at predetermined intervals on the gate oxide film 5. Each gate electrode MG is composed of a polycrystalline silicon film 6 serving as a first conductive film, an oxide-nitride-oxide (ONO) film 7, a polycrystalline silicon film 8 serving as a second conductive film and a cobalt silicide ($CoSi_2$) film 9. The polycrystalline silicon films 6 and 8 serve as a floating gate electrode and a control electrode respectively.

High-temperature oxide (HTO) films 10 serving as second insulating films are formed on sidewalls of each gate electrode MG by a low-pressure chemical vapor deposition (LPCVD) process. Each HTO film 10 has a film thickness ranging from 5 to 10 nm. A tetraethyl orthosilicate (TEOS) oxide film 11 serving as a first interlayer insulating film is buried in each region between the gate electrodes MG inside the HTO film 10. Each TEOS oxide film 11 buried in the region between the gate electrodes MG has an upper surface which is located substantially at the same level as the gate electrode MG extending from the upper surface of the substrate 11. A silicon nitride film 12 serving as a barrier film is formed on upper surfaces of the gate electrode MG and TEOS film 11. A dilute TEOS film 13 serving as a third interlayer insulating film is formed over an upper surface of the silicon nitride film 12. Since the TEOS film 11 buried between the gate electrodes MG so as to reach the vicinity of the upper end of the gate electrode MG, the silicon nitride film 12 is formed without intruding under the gate electrode MG.

Subsequently, as shown in FIG. 1B, the gate electrode SG of the selective gate transistor is also formed on the active region 3 with the gate oxide film 5 being interposed therebetween. The gate electrode SG has the same deposition structure as the gate electrode MG of the memory cell transistor. Furthermore, the polycrystalline silicon film 8 is deposited in the gate electrode SG while a part of the ONO film 7 is open, whereby the polycrystalline silicon films 6 and 8 are electrically short-circuited.

The HTO films 10 are formed on opposite sidewalls of each gate electrode 4b and silicon nitride films 14 serving as fourth insulating films are formed on the HTO films 10. A borophosphor-silicate glass (BPSG) film 15 is buried in a region inside the silicon nitride films 14. The HTO films 10, silicon nitride film 14 and BPSG film 15 have respective upper ends located lower than the upper surface of the gate electrode 4b. The silicon nitride film 12 serving as a barrier film is formed so as to assume the lower position. The d-TEOS film 13 is formed so as to fill the concavity of the silicon nitride film 12.

A contact hole is formed between the gate electrodes SG of the selective gate transistors. A TiN film 16 serving as a barrier metal is formed on an inner surface of the contact hole. A contact plug 17 is formed inside the TiN film 16 by removing a part in which no tungsten film is required to be buried.

Subsequently, in FIG. 1C, a silicon oxide film 18 with a film thickness of about 10 nm is formed on an inner surface of the trench formed in the silicon substrate 1 by the LPCVD process. A spin-on-glass (SOG) film 19 fills a region inside the silicon oxide film 18. The SOG film 19 serves as a first insulating film of an element isolation insulating film. The SOG film 19 is formed by coating polysilazane (PSZ) although will be described in more detail later. A high-density-plasma (HDP) film 20 serving as a third insulating film is formed on the upper surface of the SOG film 19. The gate oxide film 5 is formed on the upper surface of the silicon substrate 1. The HTO film 10 is formed on the gate oxide film 5 and the HDP film 20. The TEOS oxide film 11, silicon nitride film 12 and d-TEOS film 13 are sequentially formed on the HTO film 10.

Furthermore, in FIG. 1D, the STI 2 in a selective transistor forming region includes the trenches formed in the silicon substrate 1. A silicon oxide film 18 is formed on an inner surface of each trench formed in the silicon substrate 1. The SOG film 19 is formed on the bottom of each trench. The SOG film 19 has an upper surface which is located about 30 nm lower than an upper surface of the SOG film 19 at the memory cell transistor side. The HTO film 10 is formed on the upper surface of the SOG film 19. The silicon nitride film 14 is formed so as to cover an upper surface of the HTO film 10, sidewalls of each trench and an upper surface of the active region 3 of the silicon substrate 1. The BPSG film 15, silicon nitride film 12, d-TEOS film 13 are sequentially formed on the silicon nitride film 14. The aforesaid contact plug 17 is formed in a contact hole which is formed so as to open a surface of the active region 3 and configured so as to be electrically in contact with the active region 3.

Defects occurring in the fabricating process can be avoided as the result of employment of the above configuration. More specifically, the silicon oxide film 18 is formed on the inner surface of each trench by the LPCVD process, and the SOG film 19 is formed on the bottom of each trench. The HTO film 10 is formed on the upper surface of the SOG film 19. Accordingly, the SOG film 19 can be protected by the HTO film 10 in the wet etching process for the TEOS film 11. Consequently, the processing steps can be carried out without damaging the SOG film 19.

The fabricating process of the foregoing device will be described with further reference to FIGS. 3A to 24. FIGS. 3A-3D to 22A-22D show sections of various portions of the device at stages of the fabricating process and correspond to FIGS. 1A-1D respectively.

Firstly, as shown in FIGS. 3A to 3D, the gate oxide film 5 with a film thickness of 10 nm is formed on the silicon substrate 1 serving as the semiconductor substrate using a thermal oxidation technique. Subsequently, the phosphor (P)-doped polycrystalline silicon film 6 with a film thickness of 80 nm is deposited on the gate oxide film 5 by the LPCVD process and thereafter, the silicon nitride film 21 is deposited on the P-doped polycrystalline silicon film 6 with a film thickness of 100 nm.

Subsequently, as shown in FIGS. 4A to 4D, a photoresist 22 is processed into a predetermined pattern by a photolithography technique. In this case, an opening 22a is formed as a pattern for forming a trench 23 of STI 2. Subsequently, as shown in FIGS. 5A to 5D, the silicon nitride film 21, the polycrystalline silicon film 6, silicon oxide film 5 and silicon substrate 1 are sequentially etched by a reactive ion etching (RIE) process with the opening 22a of the photoresist 22 serving as a mask. Thereafter, the photoresist 22 is removed by an ashing technique.

Subsequently, as shown in FIGS. 6A to 6D, the silicon oxide film 18 with a film thickness of 10 nm is formed on the inner surface of the trench 23 by the LPCVD process. Thereafter, spin-on-glass (SOG) such as polysilazane is coated so as to be 600 nm thick, whereupon the trench 23 is filled with the coating liquid of polysilazane. Thereafter, a thermal treatment is carried out in an oxidizing atmosphere at a temperature ranging from 400° C. to 500° C. so that the polysilazane is transformed into a silicon oxide film, whereby the SOG film 19 is formed. The SOG film 19 is then polished by a chemical mechanical polishing (CMP) process with the silicon nitride film 21 serving as a stopper film, whereby planarization is carried out. As a result, the SOG film 19 is buried in the trench 23.

Subsequently, as shown in FIGS. 7A to 7D, the SOG film 19 is etched by a dilute hydrofluoric acid treatment until the surface of polysilazane arrives at the vicinity of a boundary between the gate oxide film 5 and the silicon substrate 1. Subsequently, as shown in FIGS. 8A to 8D, the HDP film 20 with a film thickness of 500 nm is formed by the HDP process, and the HDP film 20 is ground by the CMP process until the silicon nitride film 21 is exposed thereby to be planarized, whereupon the HDP film 20 is buried in the trench 23.

Subsequently, as shown in FIGS. 9A to 9D, a layer structure for formation of gate electrodes is formed. More specifically, the HDP film 20 assuming the state as shown in FIGS. 8A to 8D is etched 50 nm by the RIE process. Thereafter, the silicon nitride film 21 is removed by a hot phosphate treatment. Subsequently, the ONO film 7 (an interpoly insulating film comprising a deposition of $SiO_2$—SiN—$SiO_2$) with a film thickness of 15 nm is formed and serves as an inter-gate insulating film, and the P-doped polycrystalline silicon film 8 for a control gate electrode is formed so as to have a film thickness of 150 nm.

Subsequently, as shown in FIGS. 10A to 10D, a 150-nm-thick silicon nitride film 24 is formed successively from the state as shown in FIGS. 9A-9D. Thereafter, a photoresist 25 is processed by the photolithography technique into a pattern for formation of gate electrodes, so that openings 25a and 26b are formed. In this case, the openings 25a are formed so that spaces between gate electrodes of memory cell transistors are narrowed, whereas the openings 25b are formed so that spaces between gate electrodes of selective gate transistors are wider than the spaces between gate electrodes of memory cell transistors.

Subsequently, the gate electrodes are formed as shown in FIGS. 11A to 11D. Firstly, the silicon nitride film 24 is etched by the RIE process with the photoresist 25 serving as a mask. Subsequently, the photoresist 25 is removed, and the P-doped polycrystalline silicon film 8, ONO film 7 and P-doped polycrystalline silicon film 6 are etched by the RIE process with the silicon nitride film 24 serving as a mask, whereupon a gate electrode structure is obtained. In this case, the gate oxide film 5 is exposed at a portion between the gate electrodes as shown in FIGS. 11C and 11D.

Subsequently, as shown in FIGS. 12A to 12D, a photoresist 26 is coated by the lithography technique and patterned so that an opening 26a is formed only between the gate electrodes 4b of the selective gate transistor SG. The HDP film 20 and SOG film 19 are then etched back by the RIE process so that the boundary between the silicon substrate 1 and the gate oxide film 5 is recessed about 30 nm. Subsequently, as shown in FIGS. 13A to 13D, the photoresist 26 is delaminated by the ashing technique and thereafter, a 10-nm-thick $SiO_2$ film is formed as the HTO film 10 by the LPCVD process. Furthermore, the TEOS film 11 is formed as a film for formation of a spacer by the LPCVD process. In this case, the HTO film 10 is formed on the sidewalls of each gate electrode of the memory cell transistor and selective gate transistor, and the TEOS film 11 is formed so as to be buried in the region between the gate electrodes of the memory cell transistor. Furthermore, the HTO film 10 is formed so as to cover the upper surface of the SOG film 19 remaining on the bottom as the result of recessing and the sidewalls of the trench 23 in the portion of STI 2 of the selective gate transistor SG.

Figures 14A, 14B, 14C, 14D:
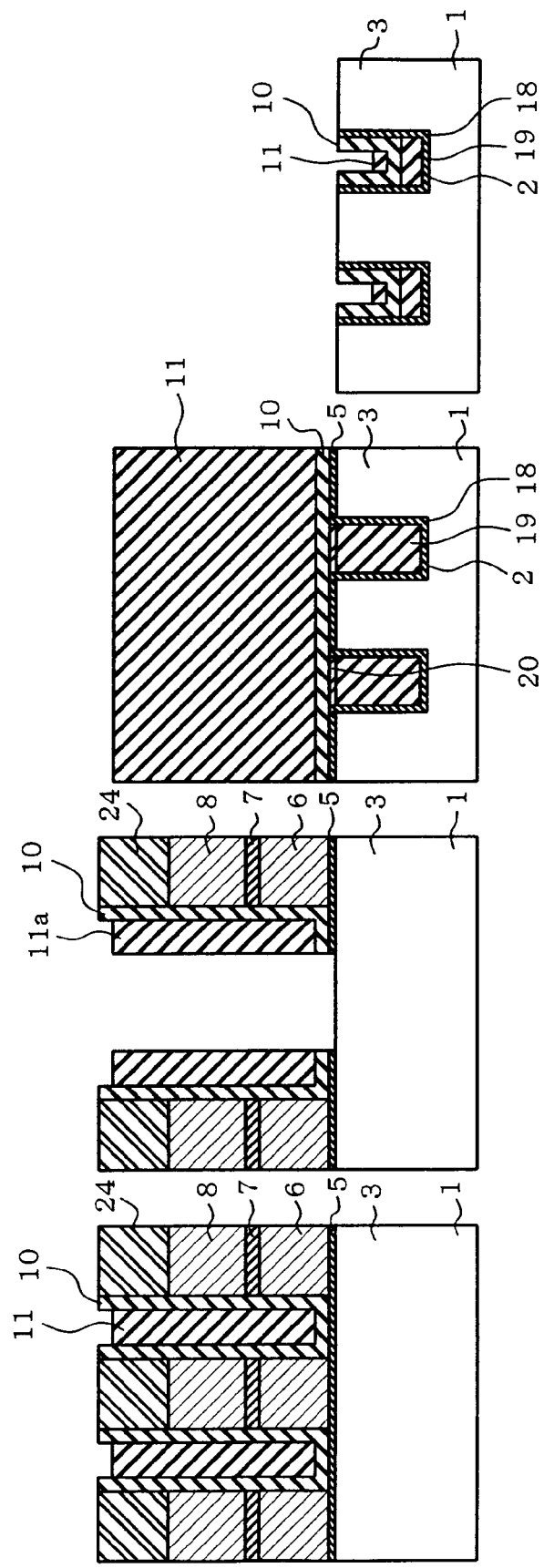
FIGS. 14A to 14D are schematic sectional views showing a twelfth stage of the fabricating process.

Subsequently, as shown in FIGS. 14A to 14D, the TEOS film 11 is etched by the RIE process, and spacers 11a are formed on the sidewalls 11a of each gate electrode of the selective gate transistor respectively. In the aforesaid etching, the TEOS film 11 and HTO film 10 remain between the gate electrodes in the region of memory cell region. Furthermore, as shown in FIG. 14D, the TEOS film 11 is etched in the portion of STI of the selective gate transistor in such a degree that the TEOS film 11 remains slightly on the bottom of the trench 23, and a portion of the HTO film on the inner surface of the trench 23 remains.

Figures 15A, 15B, 15C, 15D:
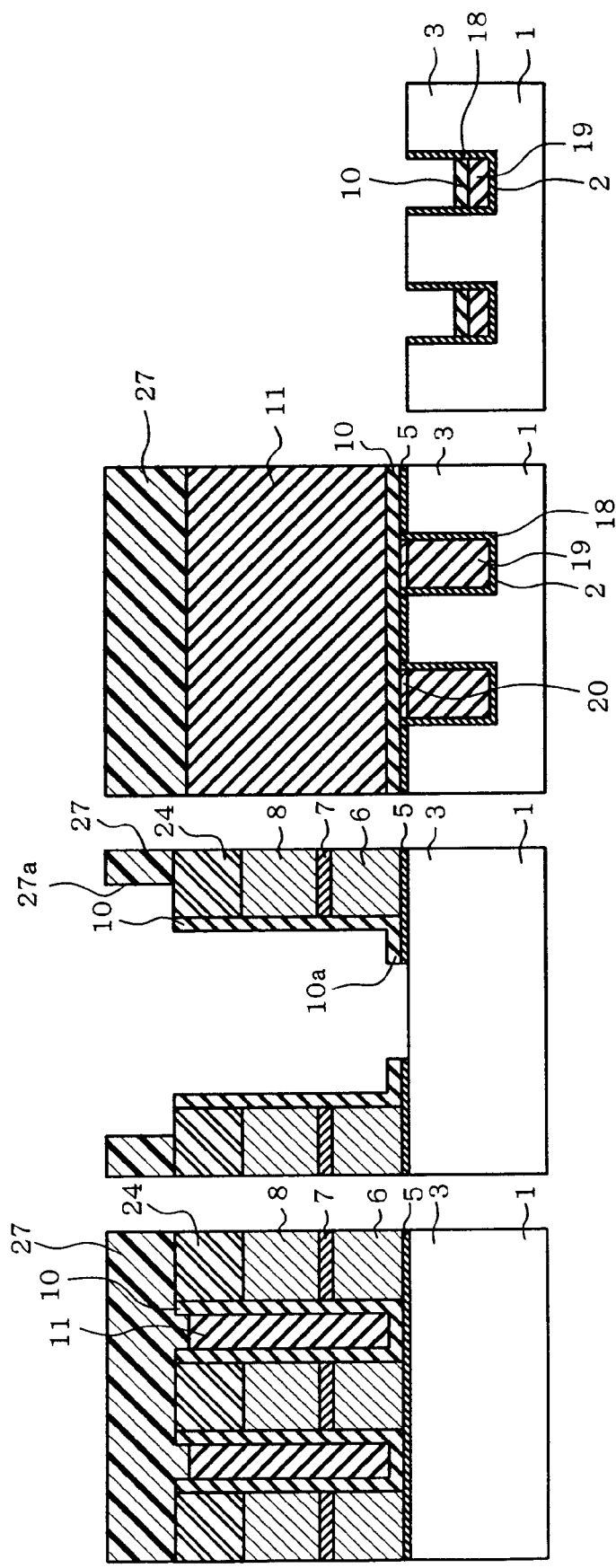
FIGS. 15A to 15D are schematic sectional views showing a thirteenth stage of the fabricating process.
Figures 20A, 20B, 20C, 20D:
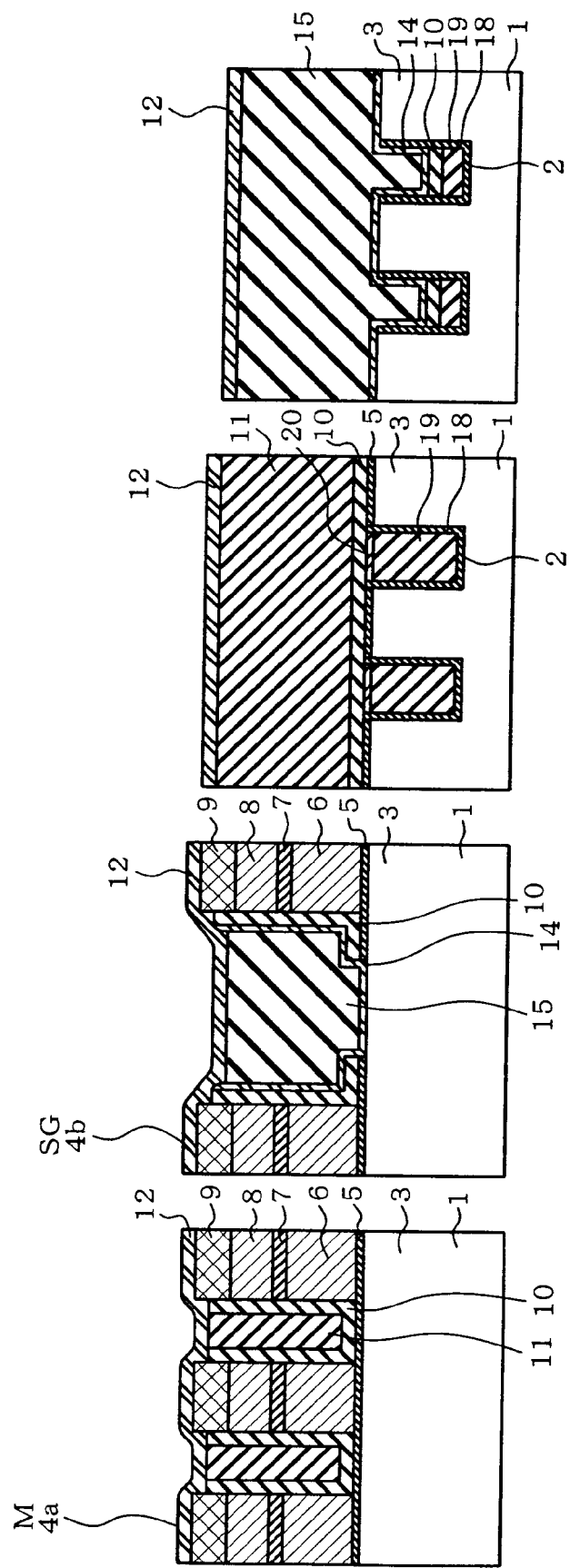
FIGS. 20A to 20D are schematic sectional views showing an eighteenth stage of the fabricating process.
Figures 21A, 21B, 21C, 21D:
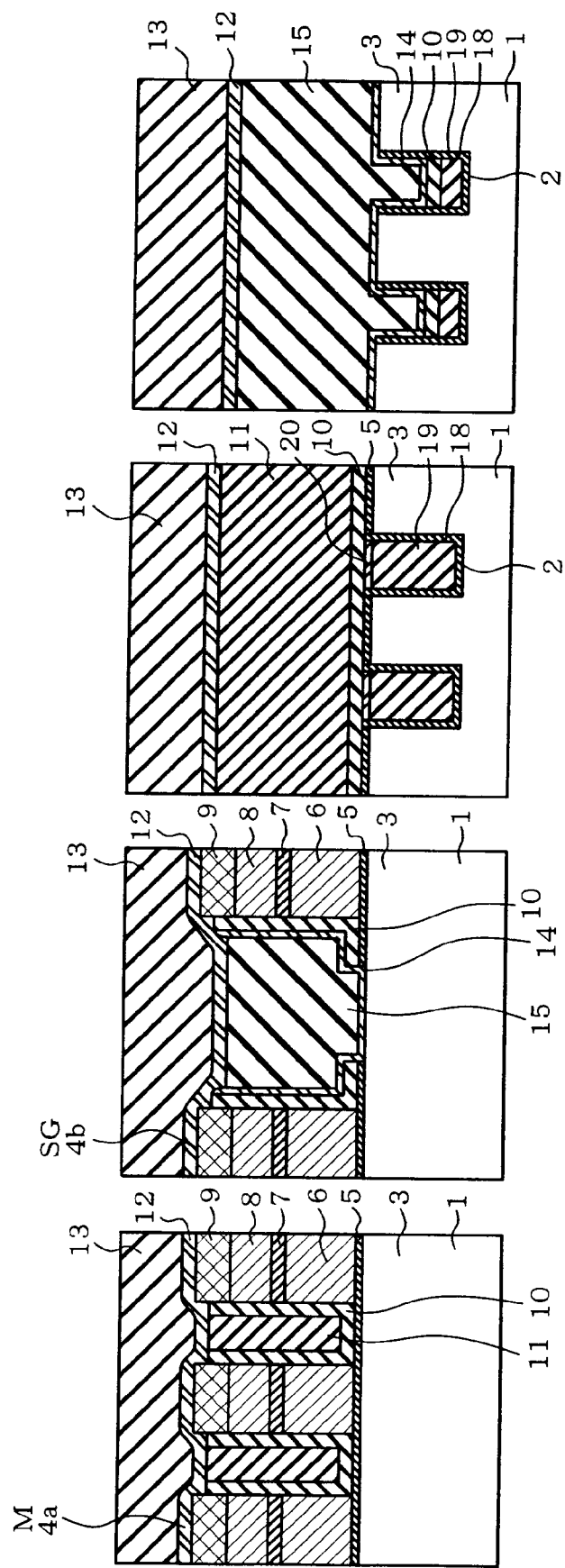
FIGS. 21A to 21D are schematic sectional views showing a nineteenth stage of the fabricating process.
Figures 22A, 22B, 22C, 22D:
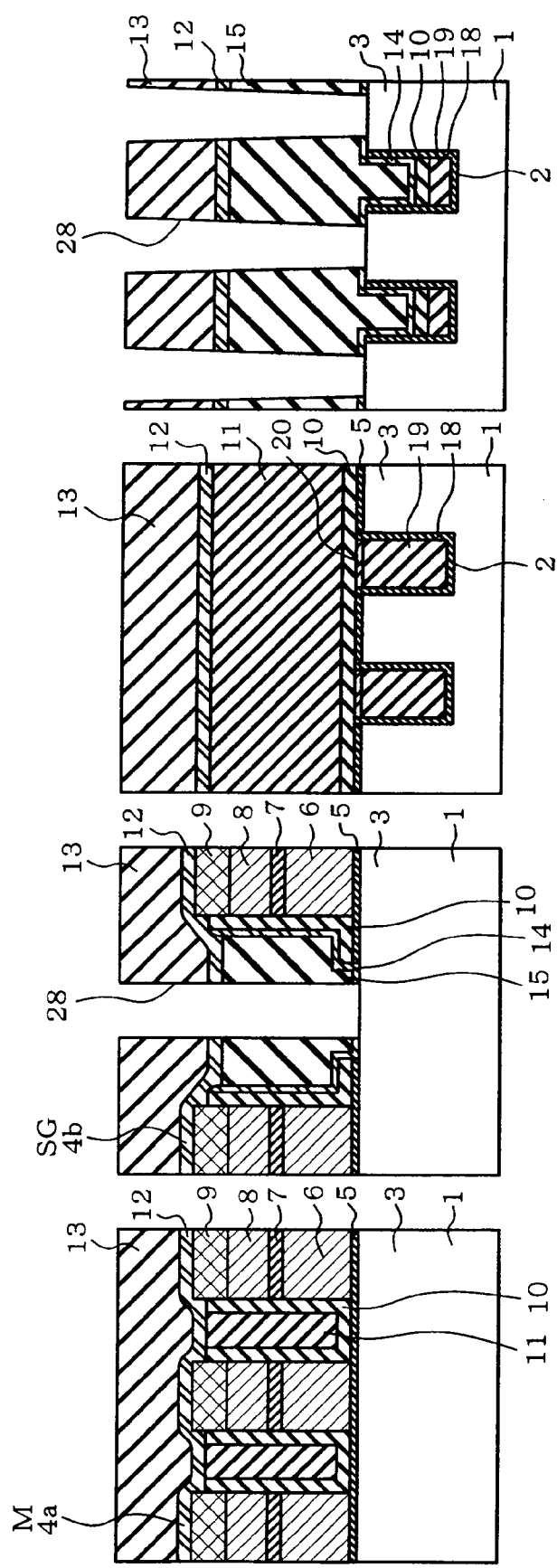
FIGS. 22A to 22D are schematic sectional views showing a twentieth stage of the fabricating process.

In the above-described state, a diffusion layer (not shown) is formed by an ion implantation method using the spacers 11a, and thereafter, as shown in FIGS. 15A to 15D, a photoresist 27 is coated by the lithography technique so that an opening 27a is formed only between the gate electrodes of the selective gate transistor. Subsequently, the wet etching process is carried out to remove the whole TEOS film 11 formed on the selective gate sidewalls as the spacers 11a by the dilute ammonium fluoride liquid treatment. In this case, the silicon substrate 1 is exposed between the gate electrodes of the selective gate transistor as shown in FIG. 15B. Furthermore, the HTO film 10 remains as a film having resistance to the wet etching on the SOG film 19 in the portion of the STI 2 as shown in FIG. 15D.

Subsequently, as shown in FIGS. 16A to 16D, the photoresist 27 is delaminated by ashing and then, the silicon nitride film 14 is formed on the upper surface. In this state, the silicon nitride film 14 is formed so as to cover the upper surfaces of the gate electrodes of the memory cell transistor as shown in FIG. 16A. However, no silicon nitride film 14 is formed between the gate electrodes. The silicon nitride film 14 is further formed so as to cover the HTO film 10 on the sidewalls of the gate electrodes and an exposed part of the silicon substrate 1 as shown in FIG. 16B.

Subsequently, as shown in FIGS. 17A to 17D, the BPSG film 15 is formed on the upper surface so that a region between the gate electrodes of the selective gate transistor is buried. Thereafter, planarization is carried out by the CMP process, whereupon the shown configuration is obtained. Subsequently, as shown in FIGS. 18A to 18D, the silicon nitride films 14 and 24 are etched back so that the upper surface of the polycrystalline silicon film 8 is exposed. Since the TEOS film 11 and HTO film 10 are also etched back in this process, the shown configuration is obtained.

Subsequently, as shown in FIGS. 19A to 19D, the cobalt silicide film 9 is formed on the upper surface of the polycrystalline silicon film 8. In this case, firstly, the cobalt silicide film 9 is formed on the upper surface as a metal film for formation of the silicide film. A thermal treatment is then carried out so that the polycrystalline silicon film 8 in contact with the cobalt film is alloyed, whereby the cobalt silicide film 9 is formed. The cobalt film is formed so that the part thereof other than the part in contact with the polycrystalline silicon film 8 is formed so as to be in contact with the insulating film. Accordingly, no silicide reaction occurs in the part in contact with the polycrystalline silicon film 8. Thereafter, the unnecessary cobalt film is etched thereby to be removed, whereupon the shown state is obtained.

Subsequently, as shown in FIGS. 20A to 20D, a barrier silicon nitride film 12 is formed on the upper surface. The silicon nitride film 12 is used as a stopper of the etching in the post-process or serves as a film for blocking off penetration of water. Furthermore, in the forming region of the memory cell transistor, the silicon nitride film 12 is also formed so as to couple upper surfaces of the gate electrodes MG to each other and so as not to enter regions between the gate electrodes MG.

Subsequently, as shown in FIGS. 21A to 21D, the d-TEOS film 13 is formed as the second interlayer insulating film. Thereafter, a photolithography process is carried out so that patterning is executed for formation of contact holes, as shown in FIGS. 22A to 22D. An etching process by the RIE process is carried out so that the contact hole 28 is formed between the gate electrodes SG of the selective gate transistor. Subsequently, a titanium nitride (TiN) film 16 serving as a barrier metal is formed in the contact hole 28, and a tungsten (W) film serving as a contact metal is formed. Thereafter, a CMP process is carried out so that contact plugs 17 of bit-line contact are formed as shown in FIGS. 1A to 1D.

The following effects can be achieved from the above-described fabricating process. In the foregoing embodiment, only the region between the gate electrodes SG of the selective gate transistor is opened, and the SOG film 19 is etched back so as to be recessed about 30 nm deep from the boundary between the silicon substrate 1 and the gate oxide film 5. As a result, the HTO film 10 and the TEOS film 11 can be buried sufficiently deep in the trench 23 in the subsequent step, and the surface of the SOG film 19 can be prevented from being exposed in the process of delaminating the TEOS film 11 serving as the spacer.

Consequently, the following defect can be avoided: prior to the aforesaid process, the surface of the SOG film 19 comprising the polysilazane film is recessed to the vicinity of the boundary between the gate oxide film 5 and the silicon substrate 1 by the dilute hydrofluoric acid treatment (see FIGS. 7A to 7D). In this treatment, when variation in the wet etching process results in insufficiency in an amount of etching, the SOG film 19 is exposed in the wet treatment (see FIGS. 12A to 12D) for delamination of the spacers 11a on the sidewalls of each gate electrode 4b of the selective gate transistor SG in a post-process.

Figure 23:
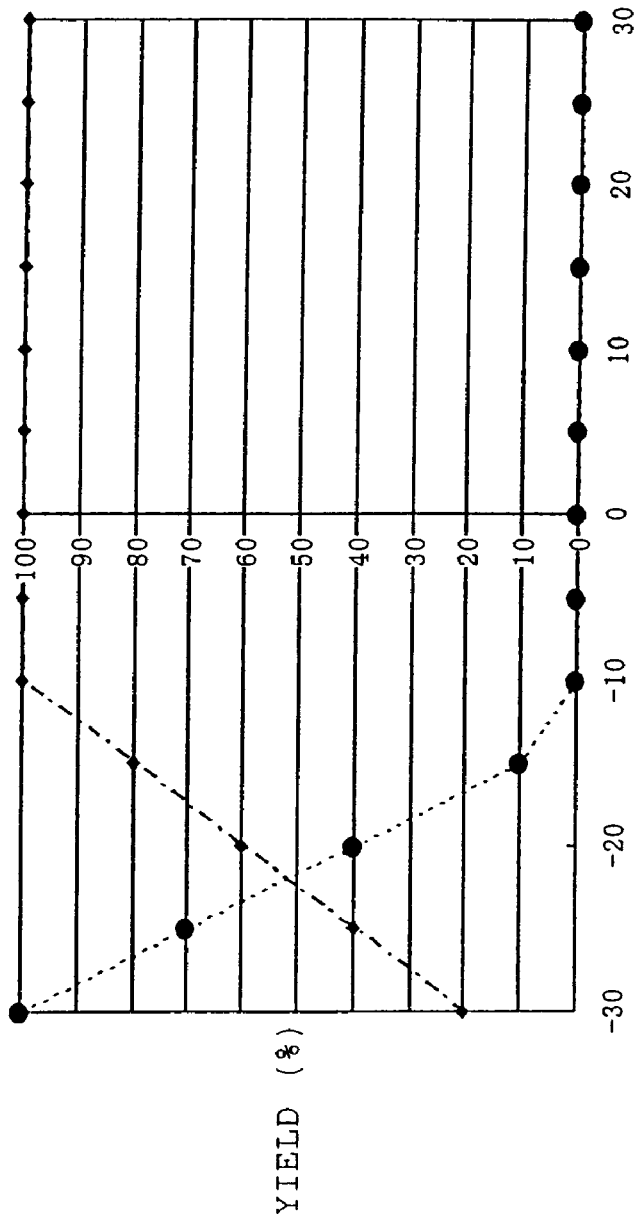
FIG. 23 is a graph showing the correlationship between a location of upper side of an SOG film and yield.
Figure 24:
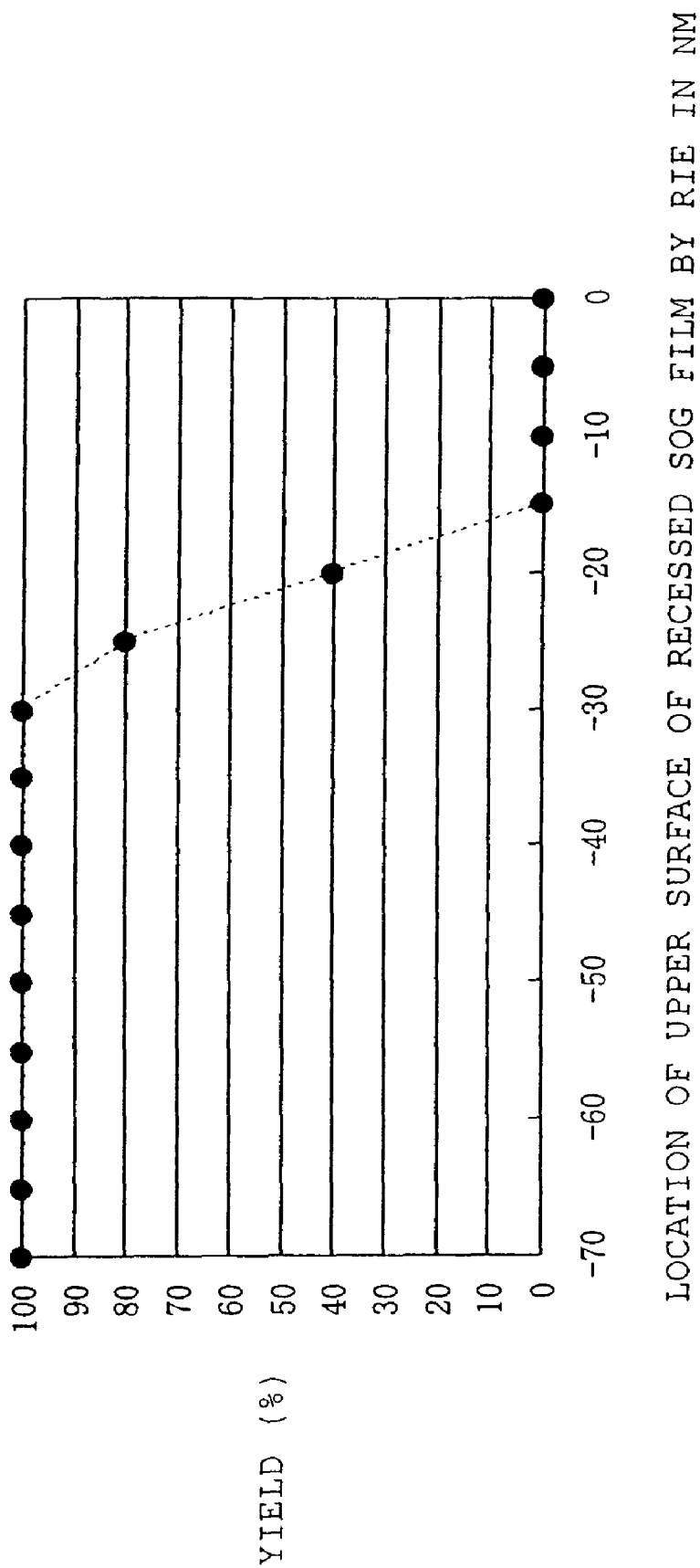
FIG. 24 is a graph showing the correlationship between concavity depth and yield.

On the other hand, as a countermeasure to avoid the aforesaid defect, an amount of etching by the wet treatment of the SOG film 19 is increased in order that exposure of the SOG film 19 may be avoided in the delamination of the spacers 11a. In this case, however, a burying aspect ratio is increased in the subsequent forming of the HDP film 10 such that defective burying occurs. FIG. 23 is a graph with an axis of abscissas designates an amount of etching of the SOG film or the location of the upper surface of SOG film on the basis of the boundary between silicon substrate and gate oxide film regarding the aforesaid defect. The inventor measured the relationship of occurrence of defect due to exposure of SOG film in the delamination of the spacers 11a (characteristic A) and a rate of occurrence of defective burying of HDP film 10 (characteristic B). These characteristics A and B are represented as yield (%).

As obvious from FIG. 23, when no countermeasures have been taken, almost no condition increasing the yield of each characteristic can be obtained and accordingly, both characteristics A and B are in the relationship of trade-off with each other. In other words, it is understood that a margin which is common to the etching of SOG film 19 and the burying of the HDP film 19 and renders an amount of etching or recessing optimum is narrow to a remarkable degree.

In the foregoing embodiment, however, employment of the above-described process can provide the configuration that the HDP film 10 and the TEOS film 11 are buried sufficiently deep in the trench 23 (see FIGS. 13A to 13D). Consequently, the upper surface of the SOG film 19 can be prevented from being exposed in the process of delaminating the spacers (FIGS. 14A to 14D).

Regarding an amount of etching as the result of execution of the RIE process as shown in FIGS. 12A to 12D, the yield obtained according to the etching amount of the SOG film 19 is satisfactory when the upper surface of SOG film 19 is recessed 30 nm deep from the upper surface of the silicon substrate 1. Accordingly, polysilazane is not damaged when an amount of etching of SOG film by RIE process is set so as to meet the aforesaid conditions. As obvious from FIG. 23, a common margin can be obtained when the upper surface of polysilazane is set so as to be lower than the silicon substrate 1 by 10 nm or above. However, polysilazane is damaged in preprocessing of the ONO film 7 (hydrofluoric acid treatment) when the upper surface is set so as to be lower by 20 nm or above. Thus, increasing an amount of etching by 20 nm or above is improper.

Furthermore, the recessing of SOG film 19 is carried out using polysilazane by the RIE process only between the gate electrodes of the selective gate transistor in the embodiment. Consequently, the selective gate transistor clearly differs from the memory cell transistor in the location of the upper surface of SOG film 19.

The invention should not be limited to the foregoing embodiment but may be modified or expanded as follows. Although polysilazane is employed as SOG film 19 is used in the foregoing embodiment, any usable material for the SOG film 19 may be used, instead.

The HTO film 10 is formed on the sidewalls of the gate electrodes 4b of the selective gate transistor in the foregoing embodiment. However, a thermally-oxidized film may be employed, instead. Furthermore, the thermally-oxidized film and the HTO film may be laminated.

The word line adjacent to the selective gate line may be a dummy word line which does not function as a memory cell.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
   a semiconductor substrate including a surface having a plurality of trenches each formed along a first direction and element regions located between the trenches;
   a pair of selective gate lines formed above the semiconductor substrate and formed along a second direction which intersects perpendicularly in the first direction;
   a plurality of word lines formed above the semiconductor substrate and formed adjacent to the selective gate lines along the second direction;
   a plurality of contact plugs located between the selective gate lines, the contact plugs being formed on the element regions respectively;
   a first insulator formed in the trenches between the word lines, the first insulator including a first insulating film having a first upper surface that is flush with the surface of the semiconductor substrate;
   a second insulator formed in the trenches between the contact plugs and including a second insulating film and a third insulating film formed on the second insulating film; and
   a boro-phosphor-silicate glass (BPSG) film formed on the third insulating film and between the contact plugs,
   wherein the second insulating film is of a kind same as the first insulating film, the third insulating film has a higher resistance to a wet etching process than the second insulating film, an interface between the second and third insulating films is located between a bottom and an upper end portion of the trench.

2. The device according to claim 1, wherein the first insulating film includes a spin-on-glass (SOG) film.

3. The device according to claim 1, wherein the third insulating film includes a high temperature oxide (HTO) film.

4. The device according to claim 1 further comprising a thermal oxide film formed on an inner surface of the trench.

5. The device according to claim 1, wherein the third insulating film has an upper surface located between the bottom and upper end portions of the trench.

6. The semiconductor device according to claim 1, further comprising a first silicon nitride film formed between the BPSG film and the selective gate lines.

7. The device according to claim 6, further comprising a second silicon nitride film formed on an upper surface of the BPSG film and an upper surface of the selective gate lines.

* * * * *